(12) United States Patent
Konrath et al.

(10) Patent No.: US 11,211,303 B2
(45) Date of Patent: Dec. 28, 2021

(54) SEMICONDUCTOR DEVICE INCLUDING A PASSIVATION STRUCTURE AND MANUFACTURING METHOD

(71) Applicant: Infineon Technologies AG, Neubiberg (DE)

(72) Inventors: Jens Peter Konrath, Villach (AT); Jochen Hilsenbeck, Villach (AT); Dethard Peters, Hoechstadt (DE); Paul Salmen, Ense (DE); Tobias Schmidutz, Munich (DE); Vice Sodan, Villach (AT); Christian Stahlhut, Rinteln (DE); Juergen Steinbrenner, Noetsch (AT); Bernd Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/701,790

(22) Filed: Dec. 3, 2019

(65) Prior Publication Data

US 2020/0185297 A1 Jun. 11, 2020

(30) Foreign Application Priority Data

Dec. 6, 2018 (DE) .......................... 102018131153.2
Nov. 19, 2019 (DE) .......................... 102019131238.8

(51) Int. Cl.
*H01L 29/417* (2006.01)
*H01L 23/31* (2006.01)
(Continued)

(52) U.S. Cl.
CPC ...... *H01L 23/3192* (2013.01); *H01L 23/3171* (2013.01); *H01L 29/0619* (2013.01);
(Continued)

(58) Field of Classification Search
CPC ............ H01L 23/3192; H01L 23/3171; H01L 29/417; H01L 29/0619; H01L 29/7811; H01L 29/7395; H01L 29/861; H01L 23/291; H01L 29/45; H01L 29/7813; H01L 29/0638; H01L 29/0615; H01L 29/872;
(Continued)

(56) References Cited

U.S. PATENT DOCUMENTS

4,559,695 A * 12/1985 Baker ............... H01L 27/14696
204/192.34
2007/0001176 A1 1/2007 Ward, III et al.
(Continued)

*Primary Examiner* — Shahed Ahmed
(74) *Attorney, Agent, or Firm* — Murphy, Bilak & Homiller, PLLC (57) ABSTRACT

An embodiment of a semiconductor device includes a semiconductor body having a first main surface. The semiconductor body includes an active device area and an edge termination area at least partly surrounding the active device area. The semiconductor device further includes a contact electrode on the first main surface and electrically connected to the active device area. The semiconductor device further includes a passivation structure on the edge termination area and laterally extending into the active device area. The semiconductor device further includes an encapsulation structure on the passivation structure and covering a first edge of the passivation structure above the contact electrode.

25 Claims, 6 Drawing Sheets

(51) Int. Cl.
    *H01L 29/06*     (2006.01)
    *H01L 29/78*     (2006.01)
    *H01L 29/739*     (2006.01)
    *H01L 29/861*     (2006.01)
    *H01L 23/29*     (2006.01)
    *H01L 29/16*     (2006.01)

(52) U.S. Cl.
    CPC ........ *H01L 29/417* (2013.01); *H01L 29/7395* (2013.01); *H01L 29/7811* (2013.01); *H01L 29/861* (2013.01); *H01L 23/291* (2013.01); *H01L 29/1608* (2013.01)

(58) Field of Classification Search
    CPC ............. H01L 29/0607; H01L 29/0603; H01L 21/822; H01L 29/66325–66348; H01L 29/7393–7398; H01L 29/083–0834
    See application file for complete search history.

(56) References Cited

U.S. PATENT DOCUMENTS

| | | | |
|---|---|---|---|
| 2014/0299890 A1* | 10/2014 | Matocha | H01L 21/045 257/77 |
| 2015/0115391 A1 | 4/2015 | Roth et al. | |
| 2015/0214164 A1* | 7/2015 | Matocha | H01L 29/7811 257/77 |
| 2015/0255362 A1* | 9/2015 | Konrath | H01L 21/02126 257/272 |
| 2019/0311966 A1* | 10/2019 | Konrath | H01L 29/0615 |
| 2020/0044078 A1* | 2/2020 | Yilmaz | H01L 29/66719 |
| 2021/0020753 A1* | 1/2021 | Mihaila | H01L 29/2003 |

* cited by examiner

SEMICONDUCTOR DEVICE INCLUDING A PASSIVATION STRUCTURE AND MANUFACTURING METHOD

TECHNICAL FIELD

The present disclosure is related to semiconductor devices, in particular to semiconductor devices including an active device area and an edge termination area as well as to manufacturing methods therefor.

BACKGROUND

Power semiconductor devices, e.g. power diodes or power transistors are typically required to block drain to source voltages or cathode to anode voltages of several hundred volts or even several thousand volts depending on the specified voltage class of the semiconductor device. High blocking voltages are accompanied by high electric field strengths in a semiconductor body. Surfaces of the semiconductor body in which high electric fields occur at high blocking voltages may be very sensitive to any charges in a passivation material above the edge termination area. Unforeseen charges in a passivation layer may lead to a reduction of the voltage blocking capability between load terminals and/or to an increase of leakage currents.

There is a need to improve passivation of semiconductor devices.

SUMMARY

An embodiment of the present disclosure relates to a semiconductor device having a semiconductor body including a first main surface. The semiconductor body includes an active device area and an edge termination area at least partly surrounding the active device area. The semiconductor device further includes a contact electrode on the first main surface. The contact electrode is electrically connected to the active device area. The semiconductor device further includes a passivation structure on the edge termination area. The passivation structure laterally extends into the active device area. The semiconductor device further includes an encapsulation structure on the passivation structure. The encapsulation structure covers a first edge of the passivation structure above the contact electrode.

A further embodiment of the present disclosure relates to a further semiconductor device that includes a semiconductor body with a first main surface. The semiconductor body includes an active device area and an edge termination area. The edge termination area at least partly surrounds the active device area. A contact electrode on the first main surface is electrically connected to the active device area. An interlayer dielectric formed on the first main surface in the edge termination area includes a first interlayer dielectric side surface above the edge termination area. A protection structure on the edge termination area covers the first interlayer dielectric side surface.

Another embodiment of the present disclosure relates to a method of manufacturing a semiconductor device. The method comprises providing a semiconductor body having a first main surface. The method further comprises forming an active device area in the semiconductor body. The method further comprises forming an edge termination area in the semiconductor body at least partly surrounding the active device area. The method further comprises forming a contact electrode on the first main surface, wherein the contact electrode is electrically connected to the active device area. The method further comprises forming a passivation structure on the edge termination area, wherein the passivation structure laterally extends into the active device area. The method further comprises forming an encapsulation structure on the passivation structure, wherein the encapsulation structure covers a first edge of the passivation structure above the contact electrode.

A further embodiment of the present disclosure relates to a further method of manufacturing a semiconductor device. The method includes providing a semiconductor body having a first main surface. An active device area is formed in the semiconductor body. An edge termination area is formed in the semiconductor body, wherein the edge termination area at least partly surrounds the active device area. A contact electrode is formed on the first main surface, wherein the contact electrode is electrically connected to the active device area. An interlayer dielectric is formed on the first main surface in the edge termination area, wherein the interlayer dielectric includes a first interlayer dielectric side surface above the edge termination area. A protection structure is formed on the edge termination area, wherein the protection structure covers the first interlayer dielectric side surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments of the semiconductor device and the method of manufacturing a semiconductor device, and together with the description serve to explain principles of the embodiments. Further embodiments and intended advantages will be readily appreciated as they become better understood by reference to the following detailed description. Further embodiments are described in the following detailed description and the claims.

DETAILED DESCRIPTION

In the following detailed description, reference is made to the accompanying drawings, which form a part thereof and in which are shown by way of illustrations specific embodiments in which a semiconductor device may be practiced. It is to be understood that other embodiments may be utilized, and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as $a \leq y \leq b$. A parameter y with a value of at least c reads as $c \leq y$ and a parameter y with a value of at most d reads as $y \leq d$.

Furthermore, the term "on" is not to be construed as meaning only "directly on". Rather, if one element is positioned "on" another element (e.g., a layer is "on" another layer), a further component (e.g., a further layer) may be positioned between the two elements.

IGFETs (insulated gate field effect transistor) are voltage controlled devices including MOSFETs (metal oxide semiconductor FETs) and other FETs with gate electrodes based on doped semiconductor material and/or with gate dielectrics that are not or not exclusively based on an oxide.

The term "power semiconductor device" refers to semiconductor devices with high voltage blocking capability of at least 30 V, for example 100 V, 600 V, 1.6 kV, 3.3 kV or more and with a nominal on-state current or forward current of at least 1 A, for example 10 A or more.

A safe operating area (SOA) defines voltage and current conditions over which a semiconductor device can be expected to operate without self-damage. The SOA is given by published maximum values for device parameters like maximum continuous load current, maximum gate voltage and others.

According to an embodiment a semiconductor device comprises a semiconductor body including a first main surface. The first main surface of the semiconductor body may be a main extension plane of the semiconductor body and is spanned by lateral directions.

The semiconductor body may include an active device area. The semiconductor body may further include an edge termination area at least partly surrounding the active device area. The semiconductor device may further include a contact electrode on the first main surface. The contact electrode may be electrically connected to the active device area, for example via an ohmic contact. The semiconductor device may further include a passivation structure on the edge termination area. The passivation structure may laterally extend into the active device area and cover a part of the contact electrode. The semiconductor device may further include an encapsulation structure on the passivation structure. The encapsulation structure may cover a first edge of the passivation structure above the contact electrode.

By providing the encapsulation structure, entry of moisture or dissolved ions, such as $OH^-$ or $H_3O^+$, from the chip package into the passivation structure may be hindered and/or prevented, for example.

The passivation structure, inter alia, comprises a top surface that faces away from the semiconductor body, the first edge, a second edge, and side surfaces (e.g. an inner side surface above the contact electrode and an outer side surface which is closer to a lateral side surface of the semiconductor body than the first edge). The top surface of the passivation structure may merge with one of the side surfaces (e.g. the inner side surface) of the passivation structure at the first edge. Further, the top surface of the passivation structure may merge with a different one of the side surfaces (e.g. the outer side surface) of the passivation structure at the second edge.

By covering (e.g. completely covering) the first edge of the passivation structure on the contact electrode, the encapsulation structure may also cover a part of the top surface of the passivation structure that merges into the side surface of the passivation structure at the first edge. The encapsulation structure may further cover (e.g. completely cover) the side surface of the passivation structure that adjoins the first edge (e.g., the inner side surface). In addition or as an alternative, the encapsulation structure may cover (e.g. completely cover) the top surface and/or the part of the top surface that merges into the side surface.

The encapsulation structure may be in direct contact with the passivation structure. In addition or as an alternative, the encapsulation structure may be in direct contact with the contact electrode (e.g. a part of the contact electrode adjacent the passivation structure).

In some embodiments, the passivation structure may be in direct contact with the contact electrode. In other embodiments, an additional layer and/or an additional structure may be positioned between the contact electrode and the passivation structure. It may be possible for the passivation structure to cover (e.g. completely cover) a side surface of the contact structure.

The semiconductor device may be a power semiconductor device, e.g. a power semiconductor diode or a power semiconductor transistor such as a power semiconductor IGFET (metal oxide semiconductor field effect transistor) or an IGBT (insulated gate bipolar transistor). The semiconductor device may be configured to conduct currents of more than 1 A and may be further configured to block voltages between load terminals of the semiconductor device in the range of several hundreds of up to several thousands of volts, e.g. at least 650V, 1.2 kV, 1.7 kV, 3.3 kV, 4.5 kV, 5.5 kV, 6 kV, or 6.5 kV. The load terminals may correspond to drain and source of a MOSFET, emitter and collector of an IGBT, or cathode and anode of a diode. The blocking voltage may correspond to a voltage class specified in a datasheet of the semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs), gallium indium phosphide (GaInP), indium antimony (InSb). Examples of II-VI compound semiconductor materials include, inter alia, cadmium telluride (CdTe), mercury-cadmium-telluride (CdHgTe), and cadmium magnesium telluride (CdMgTe). Furthermore, gallium oxide ($Ga_2O_3$), indium(III) oxide ($In_2O_3$), aluminium-osmium (AlOs), strontium titanate ($SrTiO_3$), lanthanum aluminate ($LaAlO_3$), or alkaline stannate material ($BaSnO_3$) may be used as a semiconductor material.

For SiC, the SiC semiconductor body may be from a hexagonal phase of silicon carbide, e.g., 4H—SiC. The silicon carbide semiconductor body may have an off-direction, for example in a <11-20> or a <1-100> direction. An off-axis angle of the silicon carbide semiconductor body may be in a range from 2° to 8°, typically 4°.

The active device area is an area of the semiconductor body where a load current flow enters/exits the semiconductor body through the first main surface. The active device area may be configured to carry at least a portion of a load current of the semiconductor device. In case of IGFETs, the active device area may include source regions electrically connected to the contact electrode through the first main surface. A source to drain current may flow from the contact electrode through the first main surface into the source regions. In case of IGBTs, the active device area may include emitter/source regions electrically connected to the contact electrode through the first main surface. In case of diodes, the active device area may include anode or cathode regions electrically connected to the contact electrode through the first main surface. An anode to cathode current may flow from the contact electrode through the first main surface into the anode or cathode regions. Thus, the active device area may be restricted to a first part of the first main surface through which load current flow is guided, for example.

The edge termination area is an area of the semiconductor body that surrounds (e.g., fully surrounds) the active device area. Since switching pn junctions within the active area of the semiconductor body are not infinite but terminate at the edge zones of the semiconductor body, an edge effect limits the device breakdown voltage below the ideal value that is set by a theoretical infinite parallel plane junction. Care must be taken to ensure proper and efficient termination of the switching pn junction at the edge of the semiconductor body. The edge termination area is a measure for ensuring proper and efficient termination of the switching pn junction.

In the edge termination area, edge termination structures are formed which may effectively broaden a termination of the switching pn junction of the active area towards the edge of the semiconductor body. This may result in a gradual reduction of the electric field at the edge of the semiconductor body as well as an increased blocking capability of the semiconductor device. Depending on the voltage class of the semiconductor device, a lateral dimension of the edge termination area may vary. Semiconductor devices with higher voltage classes typically require larger lateral extensions of their edge termination areas for ensuring proper termination of the switching pn junction. Examples of edge termination structures in the edge termination area include field plates, junction termination extension (JTE) structures, variation of lateral doping (VLD) structures, for example. Other than the active device area, the edge termination area may be restricted to a second part of the first main surface i) that fully or partly surrounds the first part of the active device area, and ii) through which no load current flow is guided through the first main surface to the contact electrode, and iii) that contributes to termination of the switching pn junction. There may be a transition region between the active device area and the edge termination area for electrically contacting the edge termination structure, for example.

In semiconductor devices having an n-type drift zone, an exemplary edge termination structure may include p-type and n-type regions alternately arranged toward a chip edge. Each of the p- and n-type regions may surround (e.g., fully surround) the active device area and may be arranged between the first main surface and a bottom p-type region. The p- and n-type regions may directly adjoin the first main surface, for example.

In semiconductor devices having an n-type drift zone, another exemplary edge termination structure may include p-type regions. Each of the p-type regions may surround (e.g., fully surround) the active device area and may directly adjoin the first main surface. Some or all of the p-type regions may differ from one another with respect to doping concentration. P-type regions of different doping concentration may be alternately arranged toward a chip edge. A doping concentration of some or all of the p-type regions may decrease with increasing lateral distance to the active device area, for example. There may also be groups of p-type regions having equal vertical doping concentration profiles. P-type regions of different groups may also be alternately arranged toward a chip edge.

The passivation structure may be a single layer or a stack of multiple layers. A material of the passivation structure may be chosen with respect to aspects such as, inter alia, adhesion properties of the semiconductor body and the contact electrode, defect density at an interface to the semiconductor body, mechanical properties for avoiding or minimizing stress when stacking layers such as the passivation structure and the encapsulation structure on the semiconductor body, electrical properties for ensuring that the passivation structure can withstand electric field strengths occurring during operation of the device, for example. It may be further possible that the material of the passivation structure is chosen according to at least one of: chemical resistance of the material, dielectric constant of the material, manufacturing costs for the material, tendency to trap ions (should be low), structurability.

According to an embodiment of the semiconductor device, the encapsulation structure may cover a second edge of the passivation structure. The second edge may be closer to a lateral side surface of the semiconductor body than the first edge. Thereby, coverage of the side surface of the passivation structure may be further increased.

According to an embodiment of the semiconductor device, a first lateral distance between the passivation structure and a lateral side surface of the semiconductor body may be smaller than a second lateral distance between an edge termination structure in the edge termination area and the lateral side surface of the semiconductor body. Thereby, the passivation structure may completely cover part of a first main surface that is directly above the edge termination structure. Hence, the passivation structure may protect the edge termination structure along an overall lateral dimension (e.g., a lateral width) of the edge termination structure.

According to an embodiment, the semiconductor device may further comprise an electrically insulating polymer on the encapsulation structure. Exemplary materials for electrically insulating polymers are polyimide-based materials that may act as a stress buffer passivation above the passivation structure and the encapsulation structure. The electrically insulating polymer may cushion the semiconductor device from molding compound stresses and abrasive fillers. Hence, device reliability may be improved.

According to an embodiment of the semiconductor device, the encapsulation structure may completely cover at least one side surface and/or a top surface of the passivation structure. Typically, at least an inner side surface of the passivation structure at the first edge is completely covered by the encapsulation material. For example, all side surfaces of the passivation structure may be covered by the encapsulation structure.

According to an embodiment of the semiconductor device, a thickness of the passivation structure may range from 300 nm to 5 μm. By way of example, a thickness of the passivation structure may be chosen thick enough for ensuring that image-charges at an interface between the passivation structure and the encapsulation structure do not adversely affect an effective charge in the edge termination area to an unacceptable extent. In other words, the thickness may be chosen large enough to ensure that the image-charges do not reduce a voltage blocking capability of the semiconductor device to an unacceptable degree.

According to an embodiment, the passivation structure (e.g. at least one layer of the passivation structure) may include at least one of undoped silicate glass (USG), tetraethyl orthosilicate oxide (TEOS oxide), phosphosilicate glass (PSG), borosilicate glass (BSG), borophosphosilicate glass (BPSG), silicon nitride ($Si_3N_4$).

The passivation structure may be an inorganic structure and may be a single layer that may be formed by a deposition method, for example by plasma enhanced chemical vapor deposition (PECVD). The passivation structure may also be a multi-layer stack, e.g. a USG/PSG/USG layer stack or a USG/PSG/TEOS oxide layer stack. Apart from the exemplary stacks of three layers mentioned before, also stacks of two layers, stacks of four layers, stacks of five layers, stacks of six layers, or stacks of even more than six layers may be formed. In some embodiments, each layer of the stack may comprise or consist of at least one of the above-mentioned materials.

The encapsulation structure may be an inorganic structure and may be a single layer or a stack of multiple layers. A material of the encapsulation structure may be chosen with respect to suitability as a corrosion protection layer, e.g. barrier properties against entry of moisture or dissolved ions such as $OH^-$ or $H_3O^+$, for example. The encapsulation structure may hinder moisture and dissolved ions from entering the passivation structure. This may counteract corrosion of the contact electrode at an interface between the contact electrode and the passivation structure, for example. Hence, passivation of the semiconductor device, and consequently, device reliability can be improved.

According to an embodiment of the semiconductor device, a thickness of the encapsulation structure may range from 200 nm to 2 μm, or from 200 nm to 1 μm, or from 400 nm to 800 nm. A thickness of the encapsulation structure may be smaller than a thickness of the passivation structure.

According to an embodiment of the semiconductor device, the encapsulation structure may include silicon nitride. Moisture or dissolved ions from the chip package may be hindered by the silicon nitride from entering the passivation structure.

The contact electrode on the first main surface may include a metal or a metal alloy or a metal silicide or a metal nitride or any combination thereof, e.g. a stack of different materials. Exemplary materials of the contact electrode include, inter alia, aluminum (Al), copper (Cu), tungsten (W), silver (Ag), alloys of Al and Cu such as AlCu or AlSiCu, titanium (Ti), tantalum (Ta), molybdenum (Mo), platinum (Pt), vanadium (V), gold (Au), TiN, TaN, $MoSi_2$, $TaSi_2$, for example. At a bottom of the contact electrode, a liner such as a Ti, TiN or Ti/TiN layer may be arranged for improving adhesion and/or diffusion barrier properties of the contact electrode on the semiconductor body, for example. The contact electrode may completely or partly cover the active device area and may as well slightly overlap with edge termination structures, for example.

According to an embodiment, the semiconductor device may further include an adhesive layer between the contact electrode and the passivation structure. Exemplary materials for the adhesive layer include, inter alia, $Si_3N_4$, $Al_2O_3$, and imides.

According to an embodiment of the semiconductor device, the passivation structure may directly adjoin the first main surface in the edge termination area. By way of an example, the passivation structure may directly adjoin the edge termination structure in the edge termination area, e.g. a VLD structure or a JTE structure or a guard ring structure.

According to an embodiment, the semiconductor device may further comprise an interlayer dielectric arranged between the passivation structure and the first main surface in the edge termination area. The interlayer dielectric may include one or more dielectric layers used as functional elements of the semiconductor device in other parts of the semiconductor body, for example as a gate dielectric in the active device area or as a dielectric cap on gate trench structures, for example.

According to an embodiment, the semiconductor device may be a diode and the active device area may include an anode region or a cathode region electrically connected to the contact electrode. The diode may be formed as a pn-junction diode, a Schottky diode, and/or a merged pin Schottky (MPS) diode, for example.

According to an embodiment, the semiconductor device may be a field effect transistor such as an IGFET, in particular a MOSFET or an IGBT, and the active device area may include a source region electrically connected to the contact electrode.

Another embodiment relates to a further semiconductor device. The further semiconductor device may be a power semiconductor device, e.g. a power semiconductor diode or a power semiconductor switch such as a power semiconductor IGFET or an IGBT as described above.

The semiconductor device may include a semiconductor body that may include or consist of any of the crystalline semiconductor materials mentioned above. For example, the semiconductor body may include single-crystalline SiC from a hexagonal phase, e.g., 4H—SiC.

A first main surface at the front side of the semiconductor body may be parallel to a main extension plane of the semiconductor body and is spanned by lateral directions. The first main surface may be flat or may be ribbed. For example, a semiconductor body with a hexagonal crystal lattice may have an off-axis cut. An off-axis cut angle between a horizontal mean plane of the first main surface and a <0001> base plane may be in a range from 2° to 8°, for example about 4°. An off-axis direction of the off-axis cut may be parallel to a <11-20> or parallel to a <1-100> lattice direction.

A second main surface at the back side of the semiconductor body may be flat and parallel to the main extension plane or may be ribbed with a mean plane parallel to the main extension plane. A lateral side surface may connect the edge of the first main surface and the edge of the second main surface.

The semiconductor body may include an active device area and an edge termination area. The first main surface may include an active section in the active device area and a passive section in the edge termination area. In the active device area, a diode forward current or a load current enters and/or exits the semiconductor body through the active section of the first main surface. The edge termination area of the semiconductor body surrounds (e.g., fully surrounds) the active device area. The edge termination area may separate the active device area and the lateral side surface of the semiconductor body and may extend from the active device area to the lateral side surface of the semiconductor body. The edge termination area may include an edge termination structure. The edge termination structure may include a field plate, guard rings, a JTE structure and/or a VLD structure as described above. During operation within the SOA, no load current and no diode forward current enters or exits the semiconductor body through the passive section of the first main surface in the edge termination area.

A contact electrode may be formed on the first main surface. The contact electrode may be electrically connected to doped regions in the active device area. In case the semiconductor device is a power semiconductor diode, the active device area may include anode or cathode regions and the contact electrode may be electrically connected to the anode or cathode regions. A forward current of the power semiconductor diode may flow through the first main surface active section between the contact electrode and the anode or cathode regions. In case the semiconductor device is an IGFET, the active device area may include source regions. The contact electrode may be electrically connected to the source regions through the first main surface active section. An IGFET source current may flow from the contact electrode through the first main surface active section into the source regions or vice versa. In case of IGBTs, the active device area may include emitter/source regions. The contact electrode may be electrically connected to the emitter/source regions through the first main surface active section. The contact electrode may laterally extend beyond the active device area, wherein outside the active device area, the contact electrode is spatially separated from the semiconductor body.

An interlayer dielectric may be formed on a portion of the first main surface passive section in the edge termination area. The interlayer dielectric may be a one-part structure or may be a multi-part structure including two or more laterally separated parts. For example, a metal structure forming a low-resistive ohmic contact with a doped region in the edge termination area may laterally separate two parts of a multi-part interlayer dielectric. Alternatively, a one-part interlayer dielectric may include a plurality of openings, wherein contact structures extend through the openings, and wherein the contact structures and the doped region in the edge termination area form low-resistive ohmic contacts.

The interlayer dielectric includes a top surface that faces away from the semiconductor body, one or more first side surfaces above the semiconductor body edge termination area and oriented to the closest lateral side surface of the semiconductor body, and one or more second side surfaces above the semiconductor body edge termination area and averted (facing away) from the closest semiconductor body lateral side surface. The first interlayer dielectric side surface(s) may be vertical or may have a slope angle with regard to the lateral direction, wherein the slope angle may be in a range from 30 to 90°, e.g. from 60 to 90°. The second interlayer dielectric side surface(s) may be vertical or may have a slope angle with regard to the lateral direction, wherein the slope angle may be in a range from 30 to 90°, e.g. from 60 to 90°. The contact electrode may cover the innermost second interlayer dielectric side surface. The contact electrode may also cover an inner top surface portion of the interlayer dielectric, wherein the inner top surface portion directly adjoins the innermost second interlayer dielectric side surface.

The interlayer dielectric may be a homogenous layer or may be a layer stack including two or more sub-layers, wherein directly adjoining sub-layers differ in at least one of internal structure and material composition.

For example, the interlayer dielectric may include a gate dielectric layer. The gate dielectric layer may be in direct contact with the first main surface. Alternatively, another layer, e.g., a screen oxide layer may be formed between the first main surface and the gate dielectric layer. The screen oxide layer may include silicon and oxygen, e.g., a thermally grown silicon oxide.

The gate dielectric layer may be a homogenous layer or may be a layer stack including two or more sub-layers, wherein directly adjoining sub-layers differ in at least one of internal structure and material composition. For example, the gate dielectric may consist of or may include silicon and oxygen, e.g., a thermally grown silicon oxide and/or deposited silicon oxide. Alternatively or in addition, the gate dielectric may include a sub-layer containing nitrogen, e.g., a siliconoxinitride layer and/or a silicon nitride layer, e.g., a $Si_3N_4$ layer.

The interlayer dielectric may include a separation layer formed on the semiconductor body or on the gate dielectric layer. The separation layer may be a homogenous layer or may be a layer stack including two or more sub-layers, wherein directly adjoining sub-layers differ in at least one of internal structure and material composition. For example, the separation layer may consist of or may include silicon and oxygen, e.g., a silicate glass. For example, the separation layer includes at least one layer of TEOS-USG, silane-USG, PSG, BSG, BPSG, or FSG (fluorosilicate glass).

A protection structure is formed on the edge termination area, wherein the protection structure covers (e.g. completely covers) the outermost first interlayer dielectric side surface, and wherein the outermost first interlayer dielectric side surface is the first side surface closest to the lateral side surface of the semiconductor body.

The protection structure may be a homogenous layer or may be a layer stack including two or more sub-layers, wherein directly adjoining sub-layers differ in internal structure and/or material composition. The protection structure or at least one protection structure sub-layer may be completely or nearly completely devoid of phosphorus. This may be particularly the case when the passivation structure comprises PSG. For example, a phosphor content of the protection structure is low enough to prevent phosphoric acid from building within the protection structure. For example, a mean phosphorus density in the protection structure or the concerned protection structure sub-layer is at most 5% (in weight) or even at most 2% (in weight).

The protection structure may prevent entry of moisture or dissolved ions, such as $OH^-$ or $H_3O^+$, from the ambient or from the chip package into the interlayer dielectric completely or at least to a high degree. In case the interlayer dielectric includes a layer containing phosphorus, the protection structure may contribute to suppress formation of phosphoric acid $H_3PO_4$ in a region close to the first interlayer dielectric side surface. During operation of the semiconductor device, the encapsulation of the first interlayer dielectric side surface by the protection structure may contribute in significantly reducing anodic oxidation of silicon carbide in a region close to the first interlayer dielectric side surface. Reducing or completely preventing corrosion of the silicon carbide along the first main surface reduces the risk for that portions of the interlayer dielectric and/or portions of the protection structure peel off from the semiconductor body.

By covering (e.g. completely covering) the first interlayer dielectric side surface on the edge termination area, the protection structure may also cover a part of the passive section of the semiconductor body first main surface.

The protection structure may be in direct contact with the interlayer dielectric. In addition, the protection structure may be in direct contact with the contact electrode (e.g. a part of the contact electrode adjacent to the interlayer dielectric. In other embodiments, an additional layer and/or an additional structure may be formed between the contact electrode and the protection structure. It may be possible for the protection structure to cover (e.g. completely cover) a side surface of the contact structure and/or further metal structures such as source wiring lines and/or gate wiring lines for and on the passive section of the first main surface.

According to an embodiment the protection structure may include a passivation structure. The passivation structure may be formed directly on the interlayer dielectric. The passivation structure may include silicon and oxygen as main constituents. It is possible that the passivation structure contains phosphorus atoms only as unwanted impurities. For example, in the passivation structure a mean phosphorus density is at most 5% (in weight) or at most 2% (in weight). The passivation structure may be formed from deposited silicon oxide, e.g. a silicate glass. The passivation structure may include BSG or FSG or may be an undoped layer, e.g. a layer of deposited silicon oxide, e.g. TEOS-USG. The passivation layer may contribute in reducing anodic oxidation of silicon carbide along the first main surface in the edge termination area in the presence of high electric fields.

According to an embodiment the protection structure may include an encapsulation structure formed on the passivation structure. The passivation structure and the encapsulation structure differ in internal structure and/or material composition. The encapsulation structure may be formed directly on a passivation structure top surface, wherein the passivation structure top surface is at the side of the passivation structure averted from the semiconductor body. The encapsulation structure and the passivation structure may be patterned by the same etch, e.g. a patterned passivation polymer, wherein the encapsulation structure completely covers the passivation structure top surface. The encapsulation structure may be absent along lateral side surfaces of the passivation structure.

According to an embodiment the protection structure may include a protective layer between the interlayer dielectric and the passivation structure. The protective layer may be formed directly on the interlayer dielectric. The protective layer may be a continuous layer of almost uniform thickness formed directly on the interlayer dielectric and on a surface portion of the control electrode. For example, the protective layer may completely cover the interlayer dielectric top surface, the outermost first interlayer dielectric side surface and side surfaces of the control electrode. In addition, the protective layer may cover a portion of the top surface of the control electrode. If applicable, the protection layer may also completely cover top surfaces and side surfaces of further metal structures at the front side of the semiconductor body, e.g., top surfaces and side surfaces of a source wiring line and/or a gate wiring line.

The protective layer may be effective as copper diffusion barrier and/or as interface layer improving adhesion of the protection structure on the control electrode.

The protective layer may be a homogenous layer or may be a layer stack including two or more sub-layers, wherein directly adjoining sub-layers differ in internal structure and/or material composition. The protective layer or at least one protective layer sub-layer may include silicon nitride, e.g., $Si_3N_4$. A total thickness of the protective layer may be in a range from 20 nm to 400 µm.

According to an embodiment, the edge termination area may include a channel stopper region. The channel stopper region may act as or may be a field stop region. The channel stopper region may extend from the first main surface into the semiconductor body. For example, the channel stopper region may extend along a front side edge of the semiconductor body formed between the first main surface and the lateral side surface. The channel stopper region may form a closed ring.

In case the semiconductor device is a power semiconductor diode with an anode region formed at the front side, the channel stopper region may be n-doped. In case the semiconductor device is a power semiconductor switch, the channel stopper region may have the conductivity type of the source regions (for IGFETs) or the conductivity type of the emitter/source regions (for IGBTs). For power semiconductor switches with n-doped source regions or with n-doped emitter/source regions, the channel stopper region may be n-doped. The channel stopper region may be formed from some or all ion implantations provided for forming the source regions or the emitter/source regions. For example, the channel stopper region and the source regions or the channel stopper region and the emitter/source regions may contain the same implant dose, may have the same vertical extension and/or may have the same vertical dopant profile.

According to another embodiment, a vertical extension of the channel stopper region may be significantly greater than the vertical extension of the source regions or the emitter/source regions.

During operation of the semiconductor device, the channel stopper region may reduce the electric field effective in an exposed portion of the first main surface between the outer edge of the protection structure and the lateral side surface of the semiconductor body. In this way the channel stopper region may contribute in significantly reducing anodic oxidation of silicon carbide in the edge termination area.

According to an embodiment of a method of manufacturing a semiconductor device, the method may include providing a semiconductor body including a first main surface. The method may further include forming an active device area in the semiconductor body. The method may further include forming an edge termination area in the semiconductor body at least partly surrounding the active device area. The method may further include forming a contact electrode on the first main surface, wherein the contact electrode is electrically connected to the active device area. The method may further include forming a passivation structure on the edge termination area, wherein the passivation structure laterally extends into the active device area and covers an edge of the contact electrode. The method may further include forming an encapsulation structure on the passivation structure, wherein the encapsulation structure covers (e.g. completely covers) a first edge of the passivation structure on the contact electrode.

According to another embodiment a method of manufacturing a semiconductor device may include providing a semiconductor body having a first main surface. An active device area may be formed in the semiconductor body. An edge termination area may be formed in the semiconductor body, wherein the edge termination area may at least partly surround the active device area. For example, the edge termination area may surround the active device area completely. A contact electrode may be formed on the first main surface, wherein the contact electrode may be electrically connected to the active device area. An interlayer dielectric may be formed on the first main surface in the edge termination area, wherein the interlayer dielectric may include a first interlayer dielectric side surface above the edge termination area. A protection structure may be formed on the edge termination area, wherein the protection structure may cover the first interlayer dielectric side surface. For example, the protection structure may cover the first interlayer dielectric side surface completely.

The methods may be applied for manufacturing the semiconductor device as described with respect to any of the above embodiments or any of the embodiments described below in connection with the figures. In at least some embodiments of the method and/or the semiconductor device, the following features (if applicable) apply, alone or in combination:

(i) forming the active device area in the semiconductor body includes forming source and body regions of an IGFET by introducing dopants through the first main surface by one or more ion implantation processes;

(ii) forming the active device area in the semiconductor body includes forming cathode or anode regions of a diode by introducing dopants through the first main surface by one or more ion implantation processes;

(iii) forming the edge termination area in the semiconductor body at least partly surrounding the active device area includes forming at least one of guard ring structures, variation of lateral doping structures, and junction termination extension structures by introducing dopants through the first main surface by one or more ion implantation processes;

(iv) semiconductor regions of the active device area may be concurrently formed with semiconductor regions in the edge termination area;

(v) an ion implantation process may concurrently introduce dopants for a body region in the active device area and dopants for an edge termination structure in the edge termination area;

(vi) forming the contact electrode includes layer deposition of one or more of metals, metal alloys, metal nitrides, metal silicides, and lithographically patterning the deposited layer(s) before forming the passivation structure;

(vii) forming the passivation structure includes depositing one or more layers of USG, TEOS oxide, PSG, BSG, and BPSG by plasma-enhanced chemical vapor deposition;

(viii) the encapsulation structure and the electrically insulating polymer may be concurrently patterned by using one and the same photolithographic mask;

(ix) the passivation structure may be a single layer or a stack of multiple layers;

(x) the encapsulation structure may be in direct contact with the contact electrode;

(xi) the encapsulation structure may completely cover an outer surface of the passivation structure that faces away from the semiconductor body and/or the contact electrode;

(xii) a protection structure may completely cover a first interlayer dielectric side surface oriented to the closest lateral side surface of the semiconductor body;

(xiii) the protection structure may include a protective layer and a passivation structure formed on the protective layer, wherein the passivation structure and the protective layer may be patterned by using the same etch mask;

(xiv) the protection structure may include a passivation structure and an encapsulation structure formed on the passivation structure, wherein the encapsulation structure and the passivation layer may be patterned by using the same etch mask;

(xv) the protection structure may include a passivation structure and an encapsulation structure formed on the passivation structure, wherein the encapsulation structure and the passivation layer may be patterned by using different etch masks and wherein the encapsulation structure completely covers side surfaces of the passivation structure;

(xvi) a channel stopper region is formed between an edge termination structure and the lateral side surface of the semiconductor body;

(xvii) the channel stopper region is formed by using one, some or all ion implantations used for forming source regions in the active device area.

It will be appreciated that while the method is described above and below as a series of steps or events, the described ordering of such steps or events are not to be interpreted in a limiting sense. Rather, some steps may occur in different orders and/or concurrently with other steps or events apart from those described above and below. For example, in some embodiments, semiconductor regions of the edge termination area may be formed concurrently with or before forming semiconductor regions of the edge termination area.

The embodiments described above may be combined in any way and will be further illustrated with respect to exemplary figures described below. Conductivity types illustrated in the figures, e.g. n-doped and p-doped, may also be inverted with respect to the illustrated conductivity types.

Functional and structural details described with respect to the embodiments above shall likewise apply to the exemplary figures below.

Figure 1:
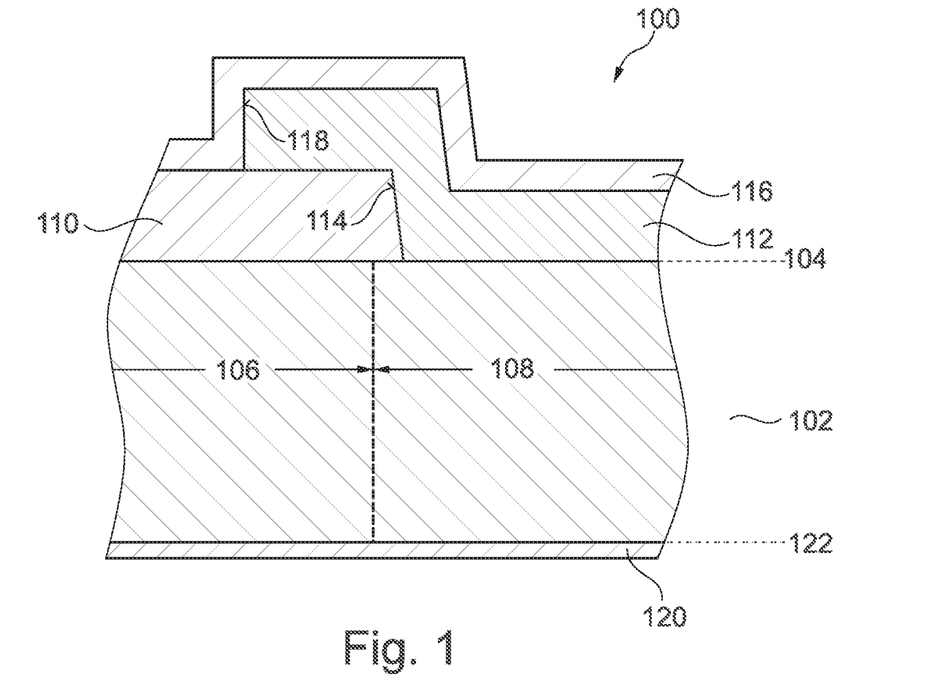
FIG. 1 illustrates a schematic cross-sectional view of an embodiment of a semiconductor device including a passivation structure and an encapsulation structure covering an edge of the passivation structure on a contact electrode.

Referring to the schematic cross-sectional view of FIG. 1, an embodiment of a semiconductor device 100 includes a semiconductor body 102 having a first main surface 104.

The semiconductor body 102 includes an active device area 106. In the active device area 106, active device structures may be formed, e.g. semiconductor regions such as source regions, body regions, body contact regions of IGFETs or IGBTs, or cathode or anode regions of diodes. A contact electrode 110 on the first main surface 104 is electrically connected to the active device area 106.

Figure 2:
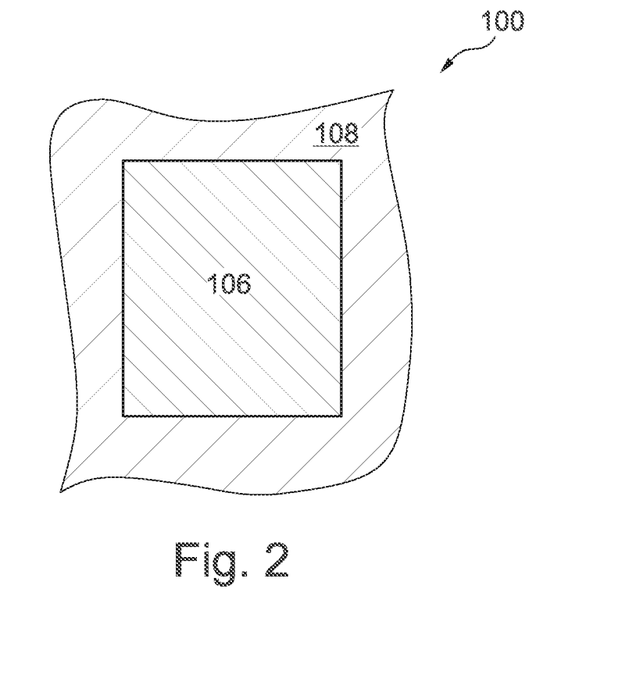
FIG. 2 is a plan view of the semiconductor device of FIG. 1.

The semiconductor body 102 includes an edge termination area 108 that partly or completely surrounds the active device area 106 (see exemplary plan view of FIG. 2).

A passivation structure 112 on the edge termination area 108 laterally extends into the active device area 106 and covers an edge 114 of the contact electrode 110.

The semiconductor device 100 further includes an encapsulation structure 116 on the passivation structure 112, wherein the encapsulation structure 116 covers a first edge 118 of the passivation structure 112 on the contact electrode 110.

The semiconductor device 100 may be a vertical semiconductor device including the contact electrode 110 on the first main surface 104 as a first load electrode and a second contact electrode 120 on a second main surface 122 as a second load electrode.

Figure 3:
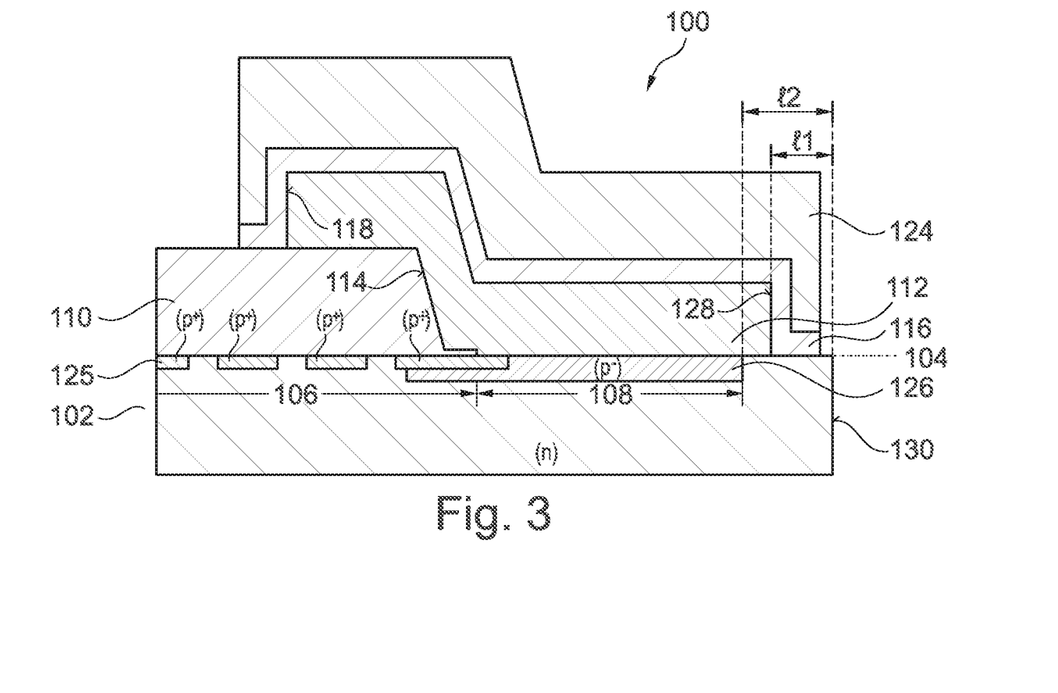
FIGS. 3 to 7 are schematic cross-sectional views of embodiments of semiconductor devices including a passivation structure and an encapsulation structure covering an edge of the passivation structure on a contact electrode.

The schematic cross-sectional view of FIG. 3 illustrates an MPS diode according to another embodiment of the semiconductor device 100. The semiconductor device further optionally includes an electrically insulating polymer 124 on the encapsulation structure 116, e.g. a polyimide-based material.

A bottom part of the contact electrode 110 may include a Schottky contact metal layer, e.g. Ti that directly adjoins the n-doped semiconductor body 102 in the active device area 106 for forming a Schottky junction and further directly adjoins p$^+$-doped anode regions 125 in the active device area 106 for forming an ohmic contact.

A p$^-$-doped junction termination extension structure 126 is formed in the edge termination area and adjoins the passivation structure 112 at the first main surface 104.

In the embodiment illustrated in FIG. 3, the encapsulation structure 116 covers a second edge 128 of the passivation structure 112. The second edge 128 of the passivation structure 112 is closer, i.e. has a smaller lateral distance to a lateral side surface 130 of the semiconductor body 102 than the first edge 118 of the passivation structure 112.

In the embodiment illustrated in FIG. 3, a first lateral distance 11 between the passivation structure 112 and the lateral side surface 130 of the semiconductor body 102 is smaller than a second lateral distance 12 between the junction termination extension structure 126 in the edge termination area 108 and the lateral side surface 130 of the semiconductor body 102. Thus, a top surface of the junction termination extension structure 130 can be completely protected by the passivation structure 112. For some applications, e.g. power modules, the electrically insulating polymer 124 on the encapsulation structure 116 may also be dispensed with.

In some embodiments, a metallization may be arranged above the contact structure and may be electrically connected to the contact structure. The metallization may be arranged above the encapsulation structure. The encapsulation structure may differ from a metallization above the contact structure with regards to its chemical composition and/or its permeability against moisture and/or ions.

Figure 4:
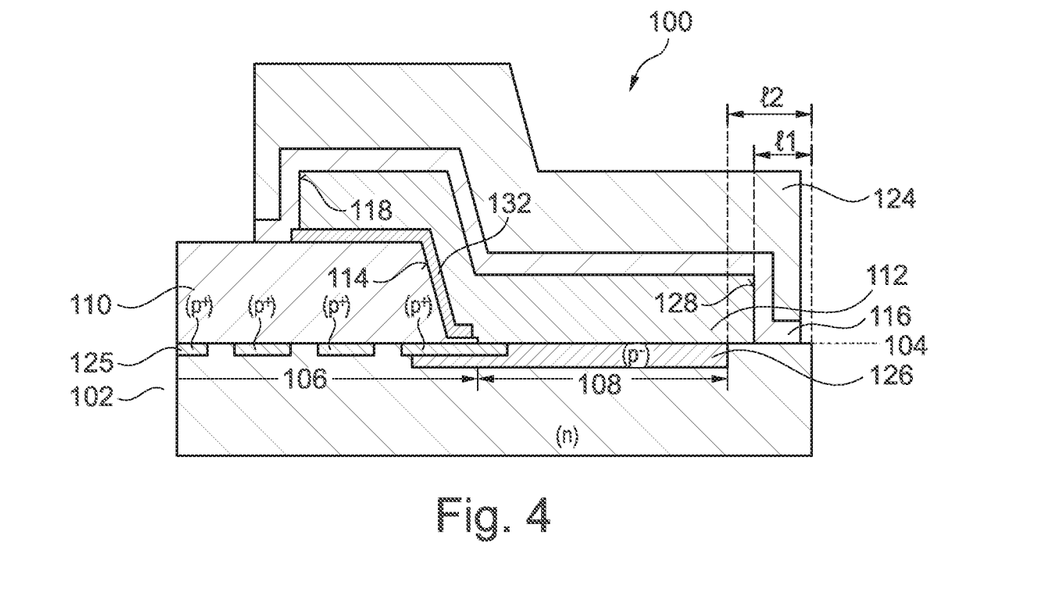

Referring to the schematic cross-sectional view of FIG. 4, the MPS diode illustrated in FIG. 3 may further include an adhesive layer 132 between the contact electrode 110 and the passivation structure 112. For some applications, e.g. power modules, the electrically insulating polymer 124 on the encapsulation structure 116 may also be dispensed with.

Figure 5:
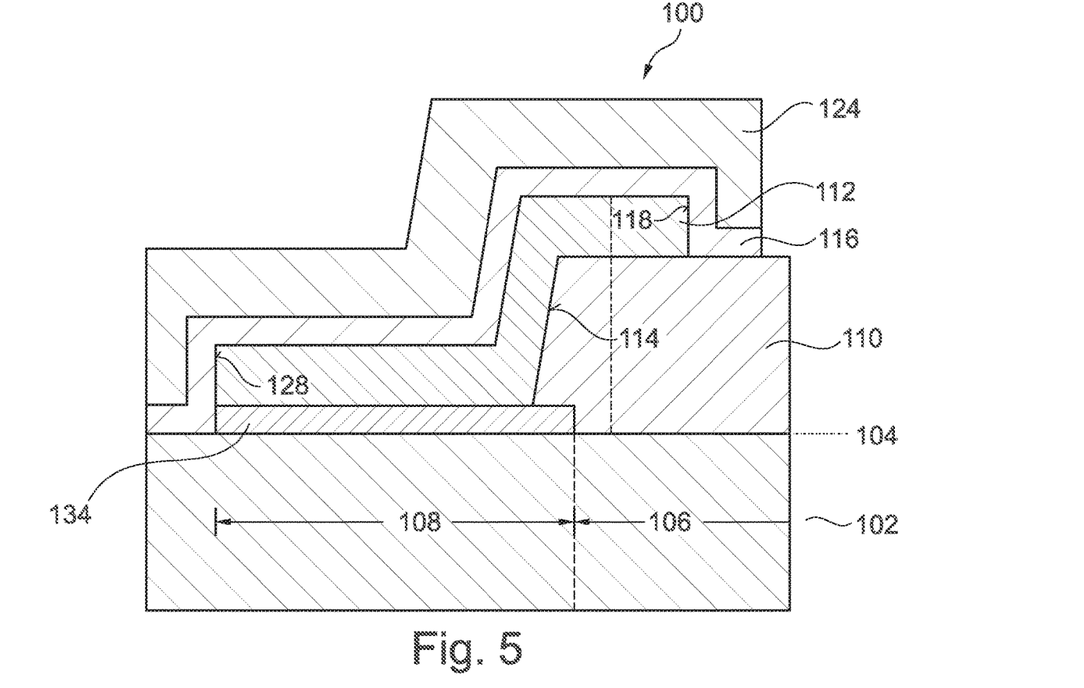

Referring to the schematic cross-sectional view of FIG. 5, the semiconductor device 100 may further include an interlayer dielectric 134 arranged between the passivation structure 112 and the first main surface 104 in the edge termination area 108. The interlayer dielectric 134 may include one or more dielectric layers. Some or all of the one or more dielectric layers may be used as functional elements of the semiconductor device in other parts of the semiconductor body, for example as a gate dielectric in the active device area 106 or as a dielectric cap on gate trench structures, for example. Similar to the embodiment illustrated in FIG. 4, the semiconductor device 100 illustrated in FIG. 5 may further include an adhesive layer 132 extending along the edge 114 of the contact electrode 110. For some applications, e.g. power modules, the electrically insulating polymer 124 on the encapsulation structure 116 may also be dispensed with.

Figure 6:
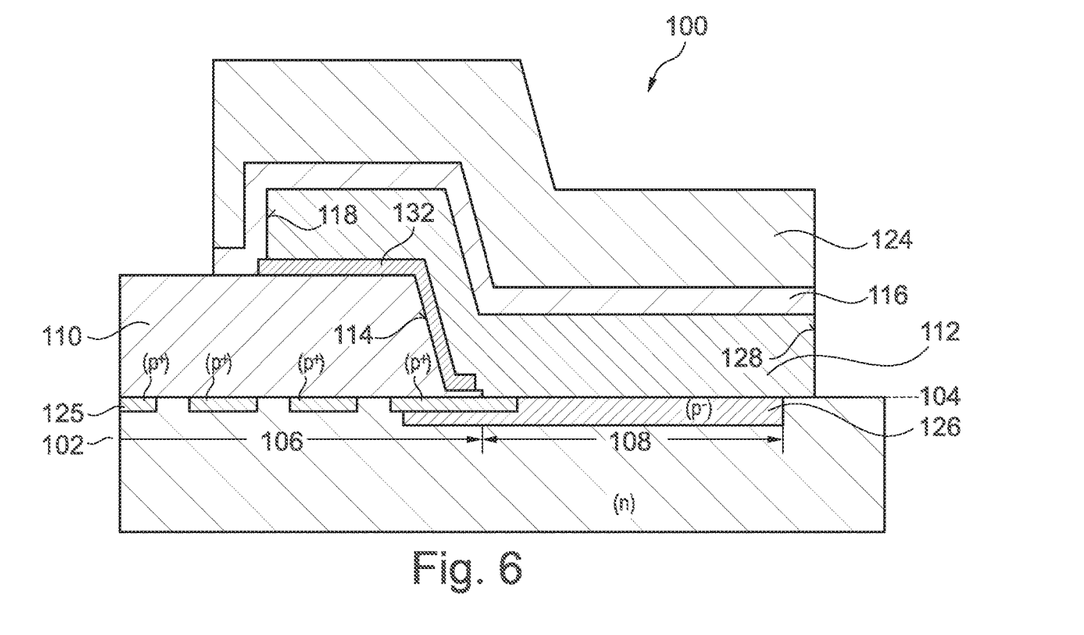

Referring to the schematic cross-sectional view of FIG. 6 which is based on the embodiment illustrated in FIG. 3, the encapsulation structure 116 may only cover the first edge 118 of the passivation structure 112, whereas the second edge 128 of the passivation structure 112 may not be covered by the encapsulation structure 116 and/or the electrically insulating polymer 124. Hence, a side surface of the passivation structure 112 at the second edge 128 may be covered by a chip molding compound of a chip package, for example.

Figure 7:
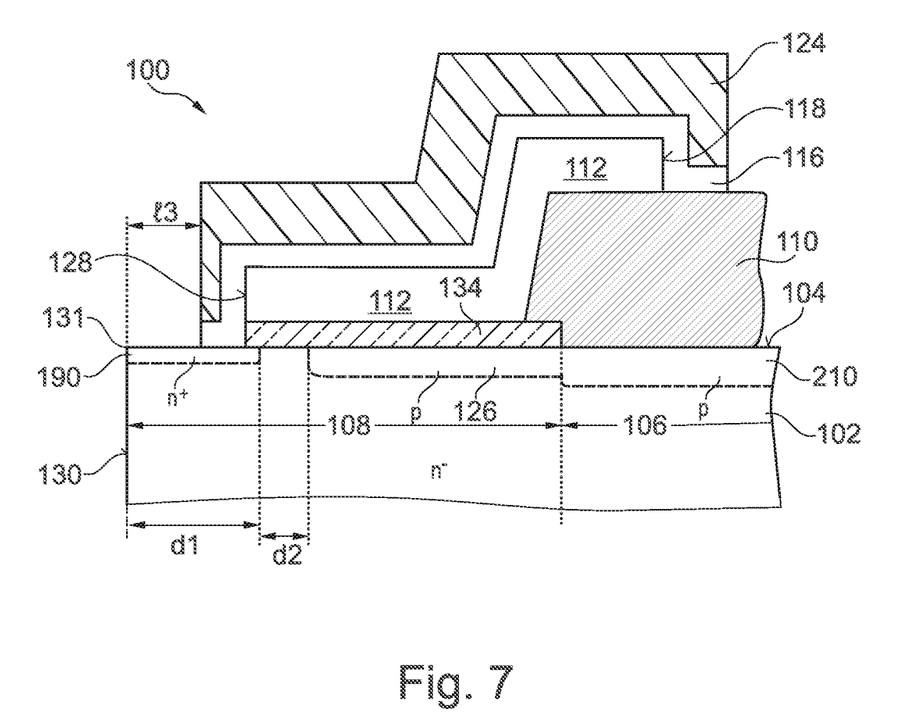

In FIG. 7 the edge termination area 108 includes a channel stopper region 190. The channel stopper region 190 is formed between the lateral side surface 130 of the semiconductor body 102 and the edge termination structure, for example between the lateral side surface 130 and a junction termination extension structure 126. The dopant type of the channel stopper region 190 is complementary to the dopant type of the JTE structure 126.

For example, for power semiconductor diodes with a p-doped anode region 210 formed at the front side in the active device area 106 and for power semiconductor switches with n-channel transistor cells, the channel stopper region 190 is n-doped. The channel stopper region 190 may contain a dopant dose in a range from $10^{18}$ to $10^{19}$ cm$^{-3}$. The anode region 210 and a lightly doped drift zone 218 may form a pn junction of a power semiconductor diode.

The channel stopper region 190 may extend from the first main surface 104 into the semiconductor body 102. The channel stopper region 190 may be in contact with the lateral side surface 130 of the semiconductor body 102. The first main surface 104 and the lateral side surface 130 of the semiconductor body 102 may form a front side chip edge 131. The channel stopper region 190 may be formed along the complete front side chip edge 131. The channel stopper region 190 may form a contiguous frame surrounding the active device area 106 and an inner portion of the edge termination area 108. The channel stopper region 190 and the drift zone 218 may form a unipolar junction.

A lateral extension d1 of the channel stopper region 190 may be greater than a distance between an outer edge of the polymer 124 and the lateral side surface 130. In other words, the lateral extension d1 of the channel stopper region 190 may be equal to or greater than a lateral width 13 of a section of the first main surface 104 exposed along the front side chip edge 131. For example, the channel stopper region lateral extension d1 is in a range from 5 µm to 50 µm. A lateral distance d2 between the edge termination structure, for example the JTE structure 126, and the channel stopper region 190 may be in a range from 3 µm to 40 µm, e.g. from 5 µm to 20 µm to accommodate the lateral electric field.

Figure 8:
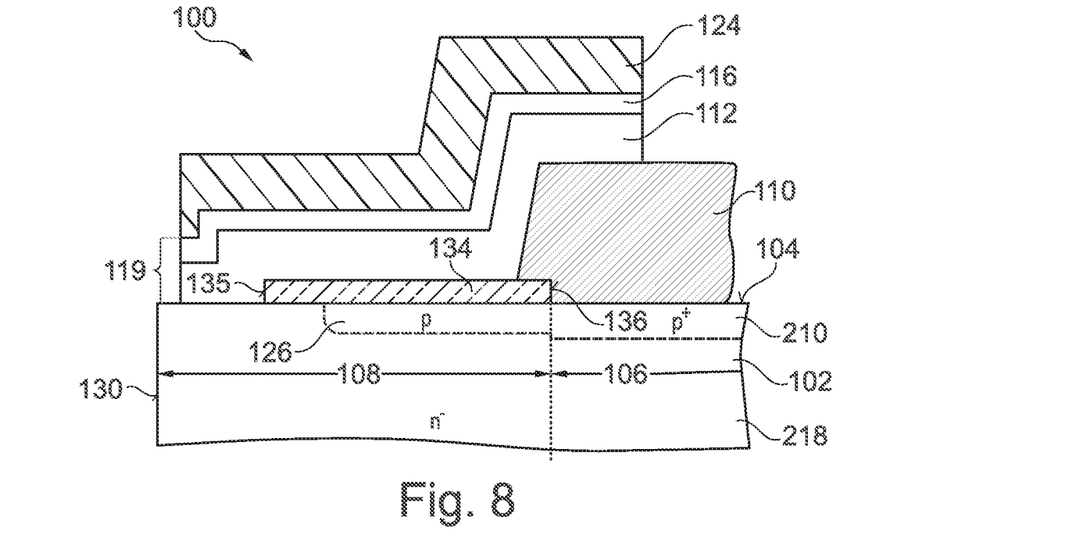
FIG. 8 illustrates a schematic cross-sectional view of an embodiment of a semiconductor device including a protection structure covering a first side surface of an interlayer dielectric above an edge termination area.
Figure 9:
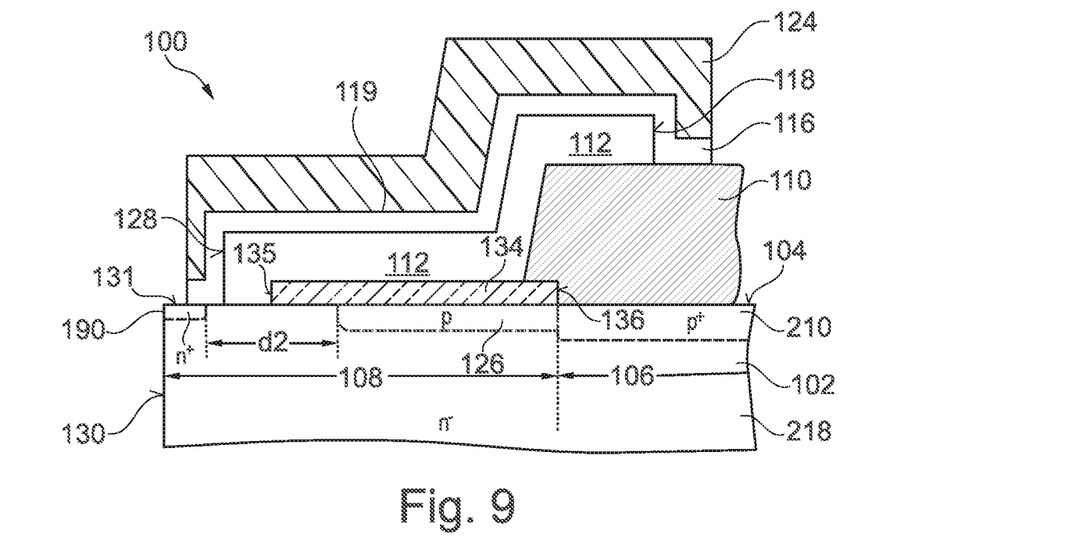
FIG. 9 illustrates a schematic cross-sectional view of an embodiment of a semiconductor device including a passivation structure covering a first side surface of an interlayer dielectric and including an encapsulation structure covering an edge of the passivation structure above an edge termination area.

FIG. 8 and FIG. 9 show protection structures 119 covering a first interlayer dielectric side surface 135 above the edge termination area 108. The protection structure 119 may include a passivation structure 112 and an encapsulation structure 116. According to another embodiment (not illustrated) the encapsulation structure 116 may be absent and the electrically insulating polymer 124 may be formed directly on the passivation structure 112. According to a further embodiment (not illustrated) the protection structure 119 may include a protective layer formed between the interlayer dielectric 134 and the contact electrode 110 at one side and the protection structure 112 at the other side.

The protection structure 119 or at least a sub-layer of the protection structure 119 in direct contact with the interlayer dielectric 134 does not contain phosphorus or contains phosphorus only as unwanted impurity. The interlayer dielectric 134 may include a dopant, for example phosphorus. For example, the interlayer dielectric 134 may include PSG or BPSG. The protection structure 119 may be a silicate glass, for example an undoped silicon glass with low moisture absorption, for example TEOS-USG.

In FIG. 8 the sub-layers of the protection structure 119 are successively deposited on the patterned interlayer dielectric 134 and patterned as a whole by using a patterned polymer 124 as etch mask.

In FIG. 9 the interlayer dielectric 134 is patterned by using a first auxiliary etch mask. A passivation layer is deposited on the patterned interlayer dielectric 134 and on the contact electrode 110. The passivation layer is patterned by using a second auxiliary etch mask to form the passivation structure 112. An encapsulation layer is deposited on the passivation structure 112 and on the contact electrode 110. The encapsulation layer is patterned by using a patterned polymer 124 as etch mask to form the encapsulation structure 118. As a result, the passivation structure 112 covers the first interlayer dielectric side surface 135 above the edge termination area 108 and the encapsulation structure 116 covers the first edge 128 of the passivation structure 112 above the edge termination area 108. A channel stopper region 190 may be formed between the first interlayer dielectric side surface 135 and the closest lateral side surface 130 of the semiconductor body 102.

Figure 10:
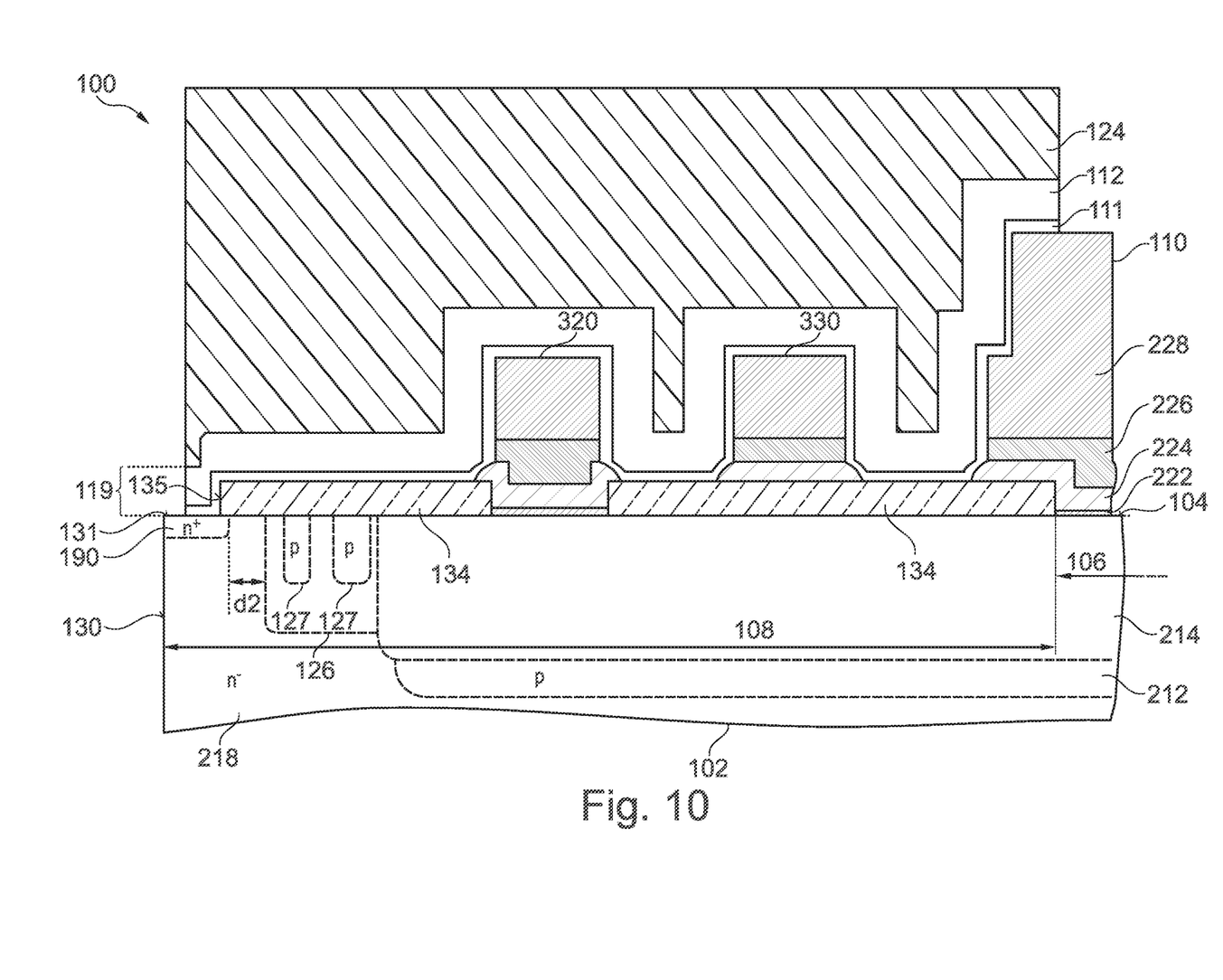
FIG. 10 illustrates a schematic cross-sectional view of an embodiment of a semiconductor device including a channel stopper region and a protection structure covering a first side surface of an interlayer dielectric above an edge termination area.

FIG. 10 shows the edge termination area 108 of a SiC-TMOSFET (SiC trench metal oxide semiconductor field effect transistor). For simplicity, transistor cells formed in the active device area 106 are not illustrated.

At a distance to the first main surface 104 a p-doped region 212 is formed in the active device area 106, wherein the p-doped region 212 laterally extends into the edge termination area 108. In the active device area 106, the p-doped region 212 may shield gate structures against a drain potential.

A more heavily doped p-doped region 214 may extend in the active device area 106 from the first main surface 104 to the p-doped region 212. The more heavily doped p-doped region 214 may laterally extend into the edge termination area 108.

The edge termination area 108 includes a p-doped JTE structure 126 extending from the first main surface 104 into the semiconductor body 102. The JTE structure 126 may laterally directly adjoin the more heavily doped p-doped region 214. The JTE structure 126 may include more heavily p-doped guard rings 127 extending from the first main surface 104 into the JTE structure 126.

A heavily n-doped channel stopper region 190 is formed between the JTE structure 126 and the lateral side surface 130 of the semiconductor body 102. A lateral distance d2 between the JTE structure 126 and the channel stopper region 190 may be in a range from 5 µm to 20 µm. The channel stopper region 190 may extend along the front side chip edge 131 and may form a contiguous frame.

An interlayer dielectric 134 covers a portion of the first main surface 104 in the edge termination area 108. The interlayer dielectric 134 may be a multi-part structure or may be a one-part structure that includes openings. An outermost side surface of the interlayer dielectric 134 closest to the lateral side surface 130 forms a first interlayer dielectric side surface 135.

The interlayer dielectric 134 may include a gate dielectric layer with a thickness in a range from 50 nm to 200 nm, e.g. 90 nm to 130 nm. The gate dielectric layer may be or may include a silicon oxide layer. The interlayer dielectric 134 may include a separation layer formed on the gate dielectric layer. The separation layer may have a thickness in a range from 400 nm to 800 nm, e.g. 550 nm to 700 nm. The separation layer may be or may include a doped silicate glass, e.g. phosphorus doped silicate glass.

A contact electrode 110 is formed above the active device area 106. The contact electrode 110 may include a copper portion 228, a copper seed layer 226, a base portion 224 and an interface portion 222. The copper portion 228 may, for instance, comprise copper (e.g., may consist of AlCu) or may consist of copper, except for unwanted impurities. The interface portion 222 may be formed directly on the semiconductor body 102 and may include, e.g. titanium (Ti) or titanium-nitride (TiN), modlybdenum (Mo) or molybdenum-nitride (MoN). The base portion 224 may be formed directly on the interface layer 222 and may include TiW, W, Ti, TiN, MoN. The copper seed layer 226 may be directly formed on the base portion 224. The copper portion 228 may have a thickness of at least 5 µm, for example a thickness in the range from 10 µm to 30 µm.

A metal source wiring line 320 may be formed on the first main surface 104 in the edge termination area 106. The source wiring line 320 and the more heavily doped p-doped region 214 may form one or more low-resistive ohmic contacts. A metal gate wiring line 330 may be formed on the interlayer dielectric 134 between the source wiring line 320 and the contact electrode 110. The source wiring line 320 may have a setup corresponding to a lower portion of the contact electrode 110 and may include an interface layer 222, a base portion 224, a copper seed layer 226 and a copper portion 228. The gate wiring line 330 may have a setup corresponding to a central portion of the contact electrode 110 and may include a base portion 224 formed on the interlayer dielectric 134, a copper seed layer 226 formed on the base portion 224 and a copper portion 228 formed on the copper seed layer 226.

A protection structure 119 completely covers the first interlayer dielectric side surface 135, an interlayer dielectric top surface, the source wiring line 320, the gate wiring line 330 and the side surfaces of the contact electrode 110. The protection structure 119 covers an outer portion of the top surface of the contact electrode 110. The protection structure 119 may include a thin protective layer 111 and a passivation structure 112 formed on the thin protective layer 111. The protective layer 111 may be a highly conformal layer with approximately uniform thickness. The passivation structure 112 may have a highly conformal layer structure with approximately uniform thickness.

The protection structure 119 covers a portion of the first main surface 104 between the interlayer dielectric 134 and the lateral side surface 130. The channel stopper region 190 is formed below an exposed section of the first main surface 104 along the front side chip edge 131 and may laterally extend to below the interlayer dielectric 134.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body having a first main surface;
an active device area in the semiconductor body;
an edge termination area in the semiconductor body and at least partly surrounding the active device area;
a contact electrode on the first main surface and electrically connected to the active device area;
a passivation structure on the edge termination area and laterally extending into the active device area; and
an encapsulation structure on the passivation structure and covering a first edge of the passivation structure above the contact electrode,
wherein the first edge side of the passivation structure intersects and extends transversely to an upper surface of the contact electrode that is opposite the first main surface, and
wherein the encapsulation structure extends along the first edge side of the passivation structure.

2. The semiconductor device of claim 1, wherein the encapsulation structure covers a second edge of the passivation structure, and wherein the second edge is closer to a lateral side surface of the semiconductor body than the first edge.

3. The semiconductor device of claim 1, wherein a first lateral distance between the passivation structure and a lateral side surface of the semiconductor body is smaller than a second lateral distance between an edge termination structure in the edge termination area and the lateral side surface of the semiconductor body.

4. The semiconductor device of claim 1, further comprising an electrically insulating polymer on the encapsulation structure.

5. The semiconductor device of claim 1, wherein the encapsulation structure completely covers at least one side surface and a top surface of the passivation structure.

6. The semiconductor device of claim 1, wherein a thickness of the passivation structure ranges from 300 nm to 5 μm.

7. The semiconductor device of claim 1, wherein the passivation structure includes at least one of undoped silicate glass, USG, tetraethyl orthosilicate oxide, TEOS oxide, phosphosilicate glass, PSG, borosilicate glass, BSG, borophosphosilicate glass, BPSG, silicon nitride, and $Si_3N_4$.

8. The semiconductor device of claim 1, wherein a thickness of the encapsulation structure ranges from 200 nm to 2 μm.

9. The semiconductor device of claim 1, wherein the encapsulation structure includes silicon nitride.

10. The semiconductor device of claim 1, further comprising an adhesive layer between the contact electrode and the passivation structure.

11. The semiconductor device of claim 1, wherein the passivation structure directly adjoins the first main surface in the edge termination area.

12. The semiconductor device of claim 1, further comprising an interlayer dielectric arranged between the passivation structure and the first main surface in the edge termination area.

13. The semiconductor device of claim 1, wherein the semiconductor device is a diode and the active device area includes an anode region or a cathode region electrically connected to the contact electrode.

14. The semiconductor device of claim 1, wherein the semiconductor device is a field effect transistor and the active device area includes a source region electrically connected to the contact electrode.

15. The semiconductor device of claim 1, wherein an edge termination structure in the edge termination area is one or a combination of a junction termination extension structure, a variation of lateral doping structure, and a guard ring structure.

16. The semiconductor device of claim 1, wherein the semiconductor body is a silicon carbide semiconductor body.

17. The semiconductor device of claim 1, wherein a ratio of a thickness of the encapsulation structure to a thickness of the passivation structure is in a range from 1:5 to 1:2.

18. The semiconductor device of claim 1, wherein the passivation structure covers an edge of the contact electrode.

19. The semiconductor device of claim 1, wherein the passivation structure comprises an upper surface of that is opposite from the upper surface of the contact electrode and extends to the first edge side of the passivation structure, and wherein the encapsulation structure directly adjoins the upper surface of the passivation structure, the first edge side of the passivation structure, and the upper surface of the contact electrode.

20. A semiconductor device, comprising:
a semiconductor body having a first main surface;
an active device area in the semiconductor body;
an edge termination area in the semiconductor body and at least partly surrounding the active device area;
a contact electrode on the first main surface and electrically connected to the active device area;
an interlayer dielectric formed on the first main surface in the edge termination area and comprising a first interlayer dielectric side surface above the edge termination area; and
a protection structure on the edge termination area and directly contacting the first interlayer dielectric side surface,
wherein the interlayer dielectric comprises an upper surface opposite from the first main surface and a lateral end extending from the upper surface of the interlayer dielectric to the first main surface, and
wherein the lateral end of the interlayer dielectric directly adjoins an edge side of the contact electrode.

21. The semiconductor device of claim 20, wherein the protection structure comprises a passivation structure, and wherein the passivation structure includes silicon and oxygen.

22. The semiconductor device of claim 21, wherein the protection structure comprises an encapsulation structure formed on the passivation structure, and wherein the passivation structure and the encapsulation structure differ in material composition and/or internal structure.

23. The semiconductor device of claim 21, wherein the protection structure comprises a protective layer between the interlayer dielectric and the passivation structure.

24. The semiconductor device of claim 20, wherein the edge termination area comprises a channel stopper region extending along an edge between the first main surface and a lateral side surface of the semiconductor body.

25. The semiconductor device of claim 20, wherein the protection structure comprises silicate glass.

* * * * *

UNITED STATES PATENT AND TRADEMARK OFFICE
CERTIFICATE OF CORRECTION

PATENT NO. : 11,211,303 B2
APPLICATION NO. : 16/701790
DATED : December 28, 2021
INVENTOR(S) : Konrath et al.

It is certified that error appears in the above-identified patent and that said Letters Patent is hereby corrected as shown below:

In the Claims

Column 20, Line 41 (Claim 19, Line 2) please change "surface of that" to -- surface that --

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*